United States Patent [19]
Wong et al.

[11] Patent Number: 5,909,387
[45] Date of Patent: Jun. 1, 1999

[54] MEMORY ARCHITECTURE FOR RECORDING OF MULTIPLE MESSAGES

[75] Inventors: Sau C. Wong, Hillsborough; Hock C. So, Redwood City, both of Calif.

[73] Assignee: Invox Technology, Campbell, Calif.

[21] Appl. No.: 08/867,473

[22] Filed: Jun. 2, 1997

[51] Int. Cl.$^6$ .................................................. G11C 27/00
[52] U.S. Cl. .................. 365/45; 365/185.29; 365/185.3; 379/88.28
[58] Field of Search ........................... 365/185.29, 185.3, 365/45; 379/88.27, 88.28

[56] References Cited

U.S. PATENT DOCUMENTS

| | | | |
|---|---|---|---|
| 5,491,809 | 2/1996 | Coffman et al. | 395/430 |
| 5,555,521 | 9/1996 | Hamada et al. | 365/185.29 |
| 5,664,060 | 9/1997 | Jarrette et al. | 379/67 |
| 5,828,592 | 10/1998 | Tran et al. | 365/45 |

*Primary Examiner*—David Nelms
*Assistant Examiner*—Tuan T. Nguyen
*Attorney, Agent, or Firm*—Skjerven, Morrill, MacPherson, Franklin & Friel, LLP; David T. Millers

[57] ABSTRACT

A semiconductor memory stores multiple messages such as multiple sound clips and includes storage cells dedicated to storage of samples that constitute the messages and EOM cells dedicated to storage of marks identifying boundaries of the messages. In one embodiment, a set of the EOM cells are together in a row of an array, and each such EOM cell is associated with storage cells in the same column of the array. Each EOM cell is erased together with associated storage cells. To avoid overerase of EOM cells, a write process for a storage cell asserts a write pulse to the associated EOM cell. Write pulses resulting from writing of multiple storage cells associated with an EOM cell, change a threshold voltage of the EOM cell from the erased state to a partially programmed state. The EOM cell associated with a boundary of a message can be programmed to a state that differs from the partially programmed state.

20 Claims, 4 Drawing Sheets

MEMORY ARCHITECTURE FOR RECORDING OF MULTIPLE MESSAGES

BACKGROUND

1. Field of the Invention

This invention relates to circuits and methods for recording multiple messages in a semiconductor memory, and particularly relates to marking the boundaries of messages stored in an analog memory.

2. Description of Related Art

Semiconductor memories can record, store, and playback continuous signals such as sound or voice signals. For example, an analog memory can record a voice signal from a microphone by periodically sampling the voice signal and writing samples in a sequence of memory cells. Reading the memory cells in the recorded sequence and sequentially applying voltages read from the memory cells to an amplifier and speaker system plays back the voice signal. As used herein, a message is a signal of limited duration that may be stored in a semiconductor memory. The amount of memory (i.e., the number of memory cells) required to store a message depends upon the duration of the message and the sampling frequency used when recording the message. Current memories have sufficient capacity to store multiple short messages in a single memory chip or array. However, memory systems that store multiple messages must identify the boundaries of individual messages so that a selected message can be played back without sequentially reading through all messages or can be erased without disturbing other messages.

One method for identifying the boundaries of messages in a memory uses special memory cells that are not used for recording samples but instead are set to identify the end of a message. For example, in a recording system that sequentially writes samples in rows of a memory array, the last memory cell in each row can be reserved for storing an end-of-message (EOM) mark. At the end of a message, the last memory cell in the last row containing samples for the message is programmed to create the EOM mark for the message. The EOM marks identify messages for playback or erase and identify memory that is available for recording of new messages.

The above described system for marking the boundaries of messages in a memory is not well suited for Flash memories. In Flash memories, entire sectors of memory cells are simultaneously erased. If the memory cells reserved for EOM marks are part of a sector containing samples, the EOM marks are erased each time the sector is erased. However, such cells may be rarely programmed, i.e. only when an associated row is the last row of a message. Accordingly, the EOM cells dedicated to marking the ends of messages may be repeatedly erased without being programmed and can become overerased. The overerased cells can disrupt operation of the memory for example, by conducting even when not selected during a read or programming. Accordingly, a system and process for recording multiple messages is sought that resists overerasing of memory cells and is better suited to Flash memory.

SUMMARY

In accordance with the invention, a Flash memory capable of storing multiple messages includes dedicated memory cells (sometimes referred to herein as EOM cells) for storing end-of-message marks identifying boundaries of messages stored in the memory. In one embodiment the EOM cells are in sectors and erased with memory cells (sometimes referred to herein as storage cells) that store data constituting the messages. In accordance with an aspect of the invention, each EOM cell not marking the end of a message is at least partially programmed. Such partial programming may be perform before, while, or after recording writes to memory cells associated with that EOM cells. The EOM cell marking the end of a message are programmed to a different level from the EOM cells not marking the end of a message or if the EOM cells are not programmed before recording can be left in an erased state to mark the end of a message. Accordingly, most EOM cells are at least partially programmed before being erased which reduces the chance of EOM cells becoming overerased.

In one embodiment of the invention, a Flash memory contains column-based sectors, and the EOM cells are all in the same row. Erasing a sector erases the one or more columns of memory cells (including EOM cells in the erased columns). A message is recorded in sectors by writing sequential samples to storage cells in a sector until the sector is full or the message ends. The write process for each sample includes applying programming pulses to the storage cell being written and applying one or more programming pulse to an EOM cell in the column containing the storage cell if the threshold voltage of the EOM cell is not at a desired level. By the time a sample is written to each storage cell in a column, the EOM cell for the column is at the desired level. Writing samples can proceed without delay for programming the EOM cell when a column is filled. When the message ends, additional programming of an EOM cell in the sector containing end of the message distinguishes the end-of-message mark from the partially programmed EOM cells. Additionally, to further reduce the chance of overerasing memory or EOM cells, an end-of-message procedure can partially program all unprogrammed storage and EOM cells in the sector containing the end of the message.

Another embodiment of the invention uses row based sectors and a column of EOM cells where each EOM cell is partially programmed when writing samples to storage cells in a row associated with the EOM cell.

Alternatively or in addition to the above described programming of EOM cells, EOM cells can be erased differently from storage cells. In particular, EOM cells for a sector can have a source line that is independent of a source line for the storage cells in the sector. During an erase operation, the EOM cells associated with a sector can have a source voltage different from that of the storage cells, and the source line voltage for EOM cells during the erase can be selected to avoid overerasure and/or to leave the EOM cells in a partially programmed state. Alternatively or in addition, during a read or playback operation, the EOM cells associated with a sector can have a source voltage that differs from the source voltage of the storage cells. In particular, the source voltage for the EOM cells during playback can be selected so that the EOM cells do not conduct when unselected even if the EOM cells are overerased and have a negative threshold voltage.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an aspect of the invention, memory cells that are dedicated for storage of marks identifying boundaries of messages recorded in a semiconductor memory, are partially programmed to avoid overerasure. The partial programming may be performed during writing to associated memory cells that store data constituting the messages. Alternatively, partial programming may occur before recording a message or may be a residual of an erase operation that selectively leaves memory cells dedicated for storage of marks in a partially programmed state having a threshold voltage that differs from an erased state for memory cells that store the messages. This reduces the chance that erase operations will overerase the memory cells used for marking message boundaries.

Figure 1:
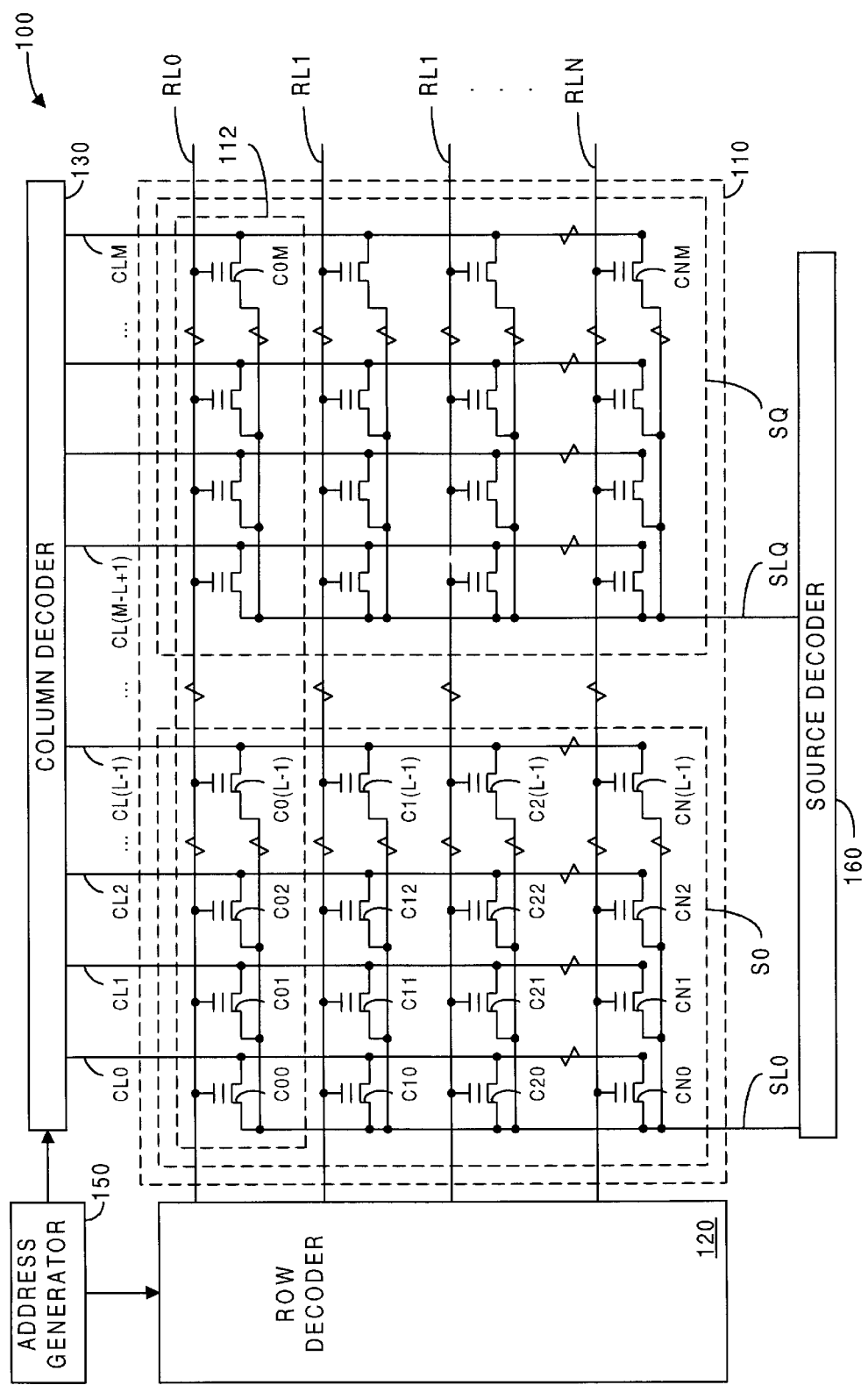
FIG. 1 shows a block diagram of a memory with column-based sectors and a row of EOM cells in accordance with an embodiment of the invention.

FIG. 1 shows a block diagram of a semiconductor memory 100 in accordance with an embodiment of the invention. Memory 100 includes an array 110 containing (N+1) rows and (M+1) columns of non-volatile semiconductor memory cells C00 to CNM. In alternative embodiments of the invention, memory cells C00 to CNM can be N-channel or P-channel devices such as floating gate transistors, split-gate transistors, or multi-transistor memory cells. In an exemplary embodiment of the invention, memory 100 contains 128,000 analog memory cells which are N-channel floating gate transistors arranged in an array of 100 rows and 1280 columns. An alternative embodiment of the invention provides a memory containing multiple arrays such as described in co-owned U.S. patent application Ser. No. 08/839,288, entitled "LOOK-AHEAD ERASE FOR SEQUENTIAL DATA STORAGE," filed Apr. 16, 1997, which is incorporated by reference herein in its entirety.

FIG. 1 shows the exemplary embodiment where memory cells C00 to CNM are N-channel floating gate transistors. Each memory cell C00 to CNM has a control gate coupled to a row decoder 120 via an associated one of row lines RL0 to RLN, a drain coupled to a column decoder 130 via an associated one of M+1 column lines CL0 to CLM, and a source coupled to a source decoder 140 via an associated one of Q+1 source lines SL0 to SLQ. (The terms drain and source as used herein distinguish terminals of a memory cell that are respectively coupled to column decoder 130 and source decoder 140. Either terminal may function as a source or a drain depending on the applied voltages.)

Array 110 is partitioned into Q+1 independently erasable sectors S0 to SQ, each sector containing L columns of memory cells. For example, the memory array in the exemplary embodiment is partitioned into 160 sectors of 8 columns each. Sectors S0 to SQ are associated with sources lines SL0 to SLQ, respectively, and each source line is coupled to all of the sources of the memory cells in the associated sector. Source decoder 140 controls the voltages on source lines SL0 to SLQ as required to erase, program, and read memory cells.

A row 112 of memory cells C00 to C0M in array 110 is dedicated to storage of EOM (end-of-message) marks, and memory cells C00 to C0M are sometimes referred to herein as EOM cells to distinguish the function of row 112 from the other memory cells in array 110. Similarly, memory cells dedicated to storage of samples which constitute the messages are sometimes referred to herein as storage cells. In the exemplary embodiment, EOM cells C00 to C0M are structurally identical to storage cells C10 to CNM in array 110. As described below, row decoder 120 treats row 112 differently than the other rows in array 110. In one embodiment of the invention, row 112 is assigned a row address within the range of row addresses for array 110, for example, the first or last row address for array 110. Alternatively, row 112 is not assigned a row address but is accessed as required during a recording operation to write EOM marks or during a playback operation that searches for the start of a desired message operation, plays the desired message, and terminates at the end of a message.

For a recording operation, sectors to contain a recorded message are erased either before the recording operation begins or simultaneously with the recording operation in a look-ahead erase process such as described in above-incorporated patent application Ser. No. 08/839,288. In the exemplary embodiment, electron tunneling erases a sector when: source decoder 140 applies a high voltage (about 12 volts) to the one of source lines SL0 to SLQ associated with the sector being erased and grounds the other source lines; row decoder 120 grounds all of the row lines RL0 to RLN; and column decoder 130 allows column lines CL0 to CLM to float. The recording operation then writes sequential samples of an analog input signal in an erased sector using a predefined order for memory cells in the sector. In the exemplary embodiment, memory cells C00 to CNM are N-channel floating gate devices having an erased state with a low threshold voltage (typically less than about 2 volts) and are programmed by raising the threshold voltage to a level in a continuous range between about 3 and 5.5 volts. The exemplary embodiment writes to memory cells by channel hot electron injection. A process for writing analog samples is described below, but alternative programming methods or mechanisms such as electron tunneling and alternative data formats such as binary or multi-level digital could also be employed.

Writing to or programming of a memory cell in the exemplary embodiment of the invention proceeds in series of write pulses during which the threshold voltage of a selected memory cell is increased. An address generator 150 generates a row address signal for row decoder 120 and a column address signal for column decoder 130 to identify a selected row line and a selected column line coupled to the selected memory cell. During a write pulse, source decoder 140 grounds all of source lines SL0 to SLQ, and column decoder 130 applies a programming voltage Vcp (typically about 6 volts) to the selected column line and grounds unselected column lines. Row decoder 120 applies a programming voltage Vrp to the selected row line and grounds the unselected row lines. The programming voltage Vrp applied to the selected row line may be fixed but preferably depends on the sample being written so that different target threshold voltages can be achieved after about the same number of write pulses.

Between write pulses are verify cycles during which memory 100 tests whether or verifies that the threshold voltage of the memory cell being programmed has reached a level that indicates the value being written. Once the threshold voltage reaches the desired level, no further write pulses are required. For a verify cycle, source decoder 140 keeps all of source lines SL0 to SLQ grounded, and column decoder 130 keeps unselected column lines grounded. However, column decoder 130 lowers the selected column line to a voltage Vcr (typically about 1 volt), and row decoder 120 lowers the selected row line to voltage Vrv which is about equal to the desired threshold voltage of memory cell. If the selected memory cell conducts during the verify cycle, the threshold voltage of the selected memory cell is less than voltage Vrv, and further write pulses are required. If the selected memory cell does not conduct during the verify cycle, the threshold voltage of the selected memory cell has reached voltage Vrv, and further write pulses are not required.

Figure 2:
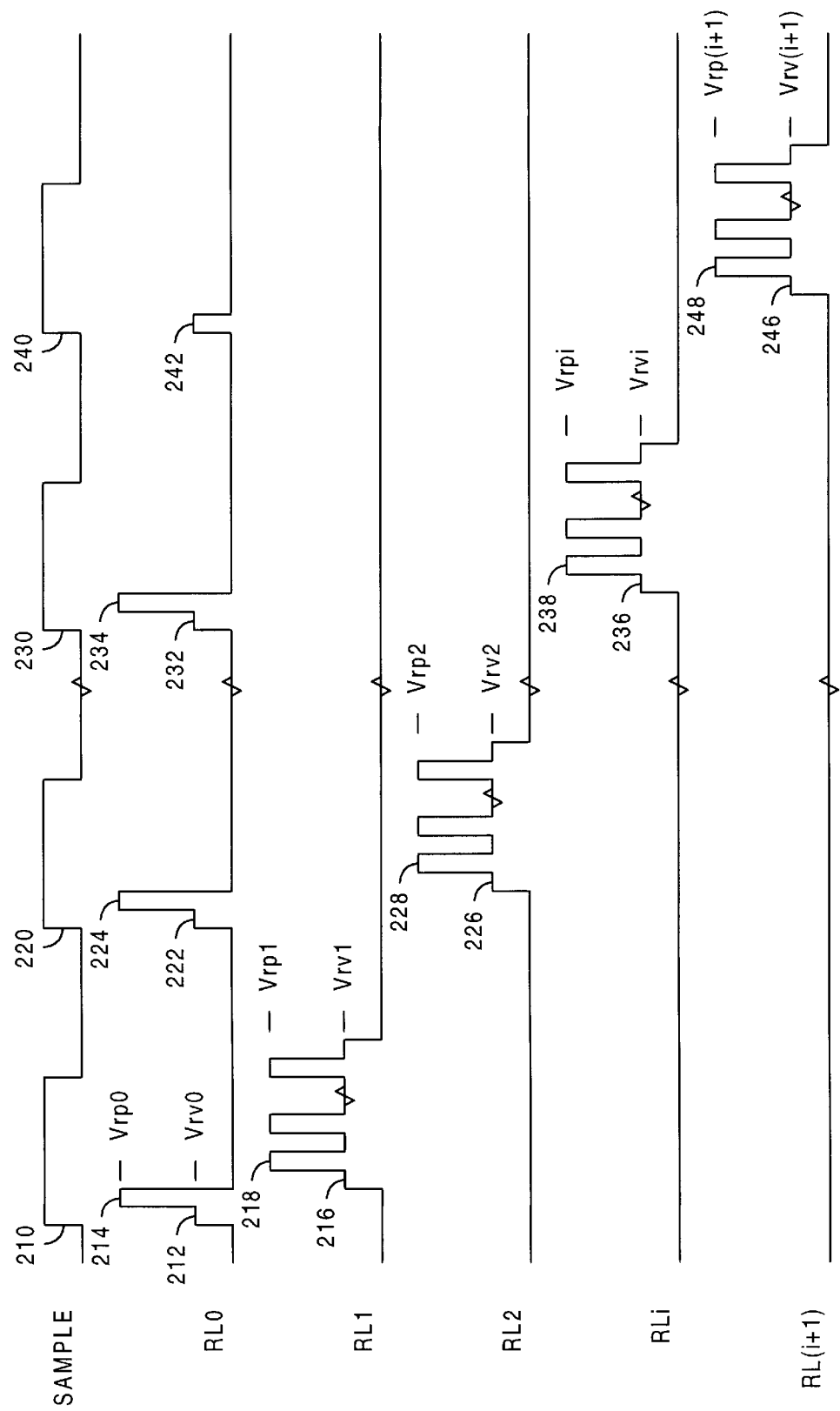
FIG. 2 shows a timing diagram of a recording operation for the memory of FIG. 1.

FIG. 2 is a timing diagram for a recording operation in accordance with an embodiment of the invention. A signal SAMPLE oscillates at a sampling frequency, typically about 4 to 8 kHz, and controls the rate at which the recording operation writes samples to storage cells. During an initial sampling period beginning at time 210, the input signal being recorded is sampled and the threshold voltage of memory cell C10 is changed from the erased state to a level representing the first sample. However, before beginning to program memory cell C10, a verify cycle 212 tests whether the threshold voltage of EOM cell C00 has reached a desired voltage. For verify cycle 212, address generator 150 generates a row address signal corresponding to the EOM cells (i.e., row line RL0), and row decoder 120 applies a voltage Vrv0 to row line RL0 while column decoder 130 applies voltage Vcr (about 1 volt) to the selected column line CL0. Voltage Vrv0 corresponds to a threshold voltage of a partially program cell, for example, a threshold voltage in the middle of a range of threshold voltages that correspond to stored analog samples.

Initially, EOM cell C00 is in the erased state which has a threshold voltage lower than voltage Vrv0. A sense amplifier not shown senses a voltage drop or a current indicating that EOM cell C00 conducts when voltage Vrv0 is applied and therefore has a threshold voltage lower than the desired level. After verify cycle 212 determines that EOM cell has a threshold voltage less than voltage Vrv0, a write pulse 214 is applied to EOM cell C00. During the write pulse, column decoder 130 applies voltage Vcp to the selected column line, and row decoder 120 applies a programming voltage Vrp0 to row line RL0. Voltage Vrp0 can be set according to desired target threshold voltage Vrv0 or set equal to a voltage Vrp1 which is used in writing the sample value to memory cell C10.

After write pulse 214 to EOM cell C00, address generator 150 changes the address signal to identify the selected memory cell C10, and a series of write pulses 218 and verify cycles 216 are generated to program memory cell C10 to a level Vrv1 that corresponds to the sample of the input signal. During write pulses 218, row decoder 120 applies voltage Vrp1 to selected row line RL1, and column decoder 130 applies programming voltage Vcp to selected column line CL0. During verify cycles 216, row decoder 120 applies voltage Vrv1 to selected row line RL1, and column decoder 130 applies voltage Vcr to selected column line CL0. Voltages Vrp1 and Vrv1 are selected according to the sample being written. In particular, voltage Vrv1 is about equal to the threshold voltage corresponding to the sample. The write to memory cell C10 is complete when memory cell C10 stops conducting during the last of verify cycles 216.

During the sampling period that begins at a time 220, a verify cycle 222 and write pulse 224 are applied to EOM cell C00, a next sample of the input signal is taken, and the next sample is written to memory cell C20 using programming voltage Vrp2 and verify voltage Vrv2 that are selected according to the sample. The voltage Vrp0 applied to row line RL0 during write pulse 224 may be equal to the voltage applied to row line RL0 during write pulse 214 or alternatively equal to voltage Vrp2 which is applied to row line RL2 when writing the sample memory cell C20. An advantage of changing voltage Vrp0 for each pulses is that row decoder 120 applies the same voltage to the row line RL0 and the selected row line. However, applying a fixed voltage to program EOM cells allows circuits that sample the input signal and generate the row line programming voltage to settle while a write pulse at a constant voltage is applied to an EOM cell.

During subsequent sampling periods, verify cycles and write pulses are applied to EOM cell C00, and the threshold voltage of EOM cell C00 increases until the threshold of EOM cell C00 reaches the level indicated by voltage Vrv0. In FIG. 2, a write pulse 234, which is during a sampling period, which begins at a time 230, raises the threshold voltage of EOM cell C00 to the desired level so that during a following sampling period, which begins at a time 240, EOM cell C00 does not conduct during a verify cycle 242. Further, write cycles to EOM cell C00 after verify cycle 242 are suppressed during sampling periods in which samples are written to memory cells C(i+1)0 to CN0.

Recording of the message can continue in a similar fashion by writing samples to the column of memory cells C11 to CN1 coupled to column line CL1. During writing to memory cells C11 to CN1, a write pulse is applied to EOM cell C01 during each sampling period until the threshold voltage of EOM cell C01 reaches the desired level. Recording continues column-by-column until EOM cells CL0 to CL(L−1) have the desired threshold voltage, and sector S0 is otherwise filled with samples. Recording then continues writing samples column-by-column through a next sector and subsequent sectors. Since programming each EOM cell is spread over a number of sampling periods, writing of the samples can be maintained at the sampling frequency without interruption for programming EOM cells.

When the end of a message is reached, which may occur in the middle of writing samples to a column or sector, an end-of-message procedure is performed. A simple end-of-message procedure applies additional programming pulses and verify cycles to store an EOM mark in an EOM cell, for example the EOM cell of the column containing the last memory cell storing a sample for the message or the EOM cell of the last column in the sector containing the last sample of a message. The EOM mark may be, for example, a threshold voltage as high or higher than the highest threshold voltage in the range associated with values stored in the memory cells and may be raised to that level by applying more programming pulses at voltage Vrp or higher. In addition to setting the EOM mark, the end-of-message procedure can partially program all unprogrammed memory cells (storage and EOM cells) in the sector containing the last sample of the message. This reduces the problem of memory cells in the latter columns of sectors being over-erased.

An alternative method for setting an EOM mark programs the EOM cell in the last column containing a sample up to the desired partially programmed level and leaves the EOM cell in the next column in the erased state where the erased state of the EOM cell is the EOM mark. This method may waste storage capacity if a message ends in the last column of a sector so that the column containing the mark is in a following sector that is used solely for storing the EOM mark. Additionally, leaving EOM cells in the erased state allows the possibility of repeated erases without intervening writes. However, for messages of random lengths much greater than the duration of a single sector the chances of repeatedly leaving an EOM cell in the erased state is small.

The recording process of FIG. 2 can be varied in a variety of ways. For example, instead of providing only a single write pulse to an EOM cell per sampling period, multiple write pulses may be used if necessary to ensure that the EOM cell reaches the desired level before a sample is written to the last sample in the column. Additionally, one or more write pulses can be applied to the EOM cell after a selected storage cell is raised to the threshold voltage corresponding to a sample being written. Pulses applied to an EOM cell after writing a sample may be in addition to or in place of write pulses to the EOM cell preceding writing of the sample, and the maximum number of write pulses after writing a sample may be fixed or dependent on the time remaining in the sampling period after writing a sample. As another variation, verify cycles for the EOM cells can be omitted if programming voltage Vrp0 for write pulses to the EOM cells is selected so that writing an entire column of samples cannot increase the threshold voltage up to the level indicating an EOM mark.

Figure 3:
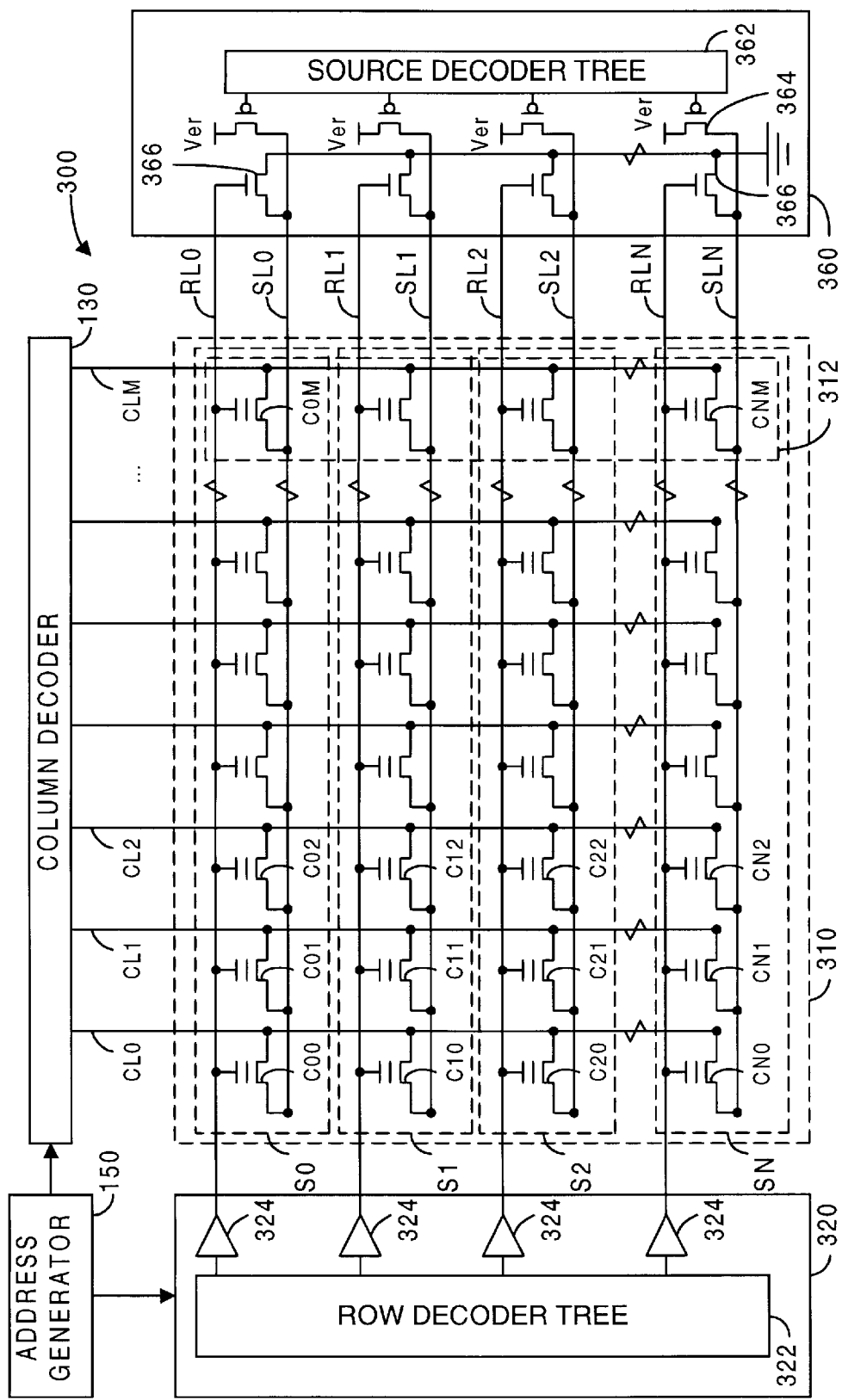
FIG. 3 shows a block diagram of a memory with row-based sectors and a column of EOM cells in accordance with an embodiment of the invention.

FIG. 3 shows a memory 300 having row-based erase sectors. In memory 300, each row of an array 310 is an independently erasable sector having an associated row line RL0 to RLN coupled to a row decoder 320 and an associated source line SL0 to SLN coupled to a source decoder 360. Alternatively, each sector could contain multiple rows of memory cells. Row decoder 320 includes a conventional decoder tree 322 of transistors that select a single word line corresponding to a row address for address generator 150. A driver 324 for the selected row line applies a voltage to the selected row line as required for a read, write pulse, or verify cycle. Drivers 324 for unselected row lines ground the associated row line. Source decoder 360 includes transistors 366, each of which is associated with a row line and has a gate coupled to the associated row line. Each transistor 366 has a source couple to ground and a drain coupled to the source line of the associated row. Accordingly, transistors 366 ground only the row line that row decoder 320 selected. Source decoder 360 also includes a source decoder tree which is used for erase operations. During an erase, source decoder selects a sector identified by a sector number and turns on a transistor 364 coupled between the source line for the sector and an erase voltage Ver.

Array 310 includes a column of EOM cells C0M to CNM so that each row has an associated EOM cell. A recording operation for memory 300 can be performed in a fashion similar to that described in regard to FIG. 2 with a primary difference being that sequential samples are written to addresses that fill a sector of one or more rows of storage cells before changing to a row address in the next sector rather than filling columns as described above. Additionally, each write process to a memory cell includes one or more write pulse to an EOM cell in the same row as the memory cell until the EOM cell reaches the desired partially programmed level.

Figure 4:
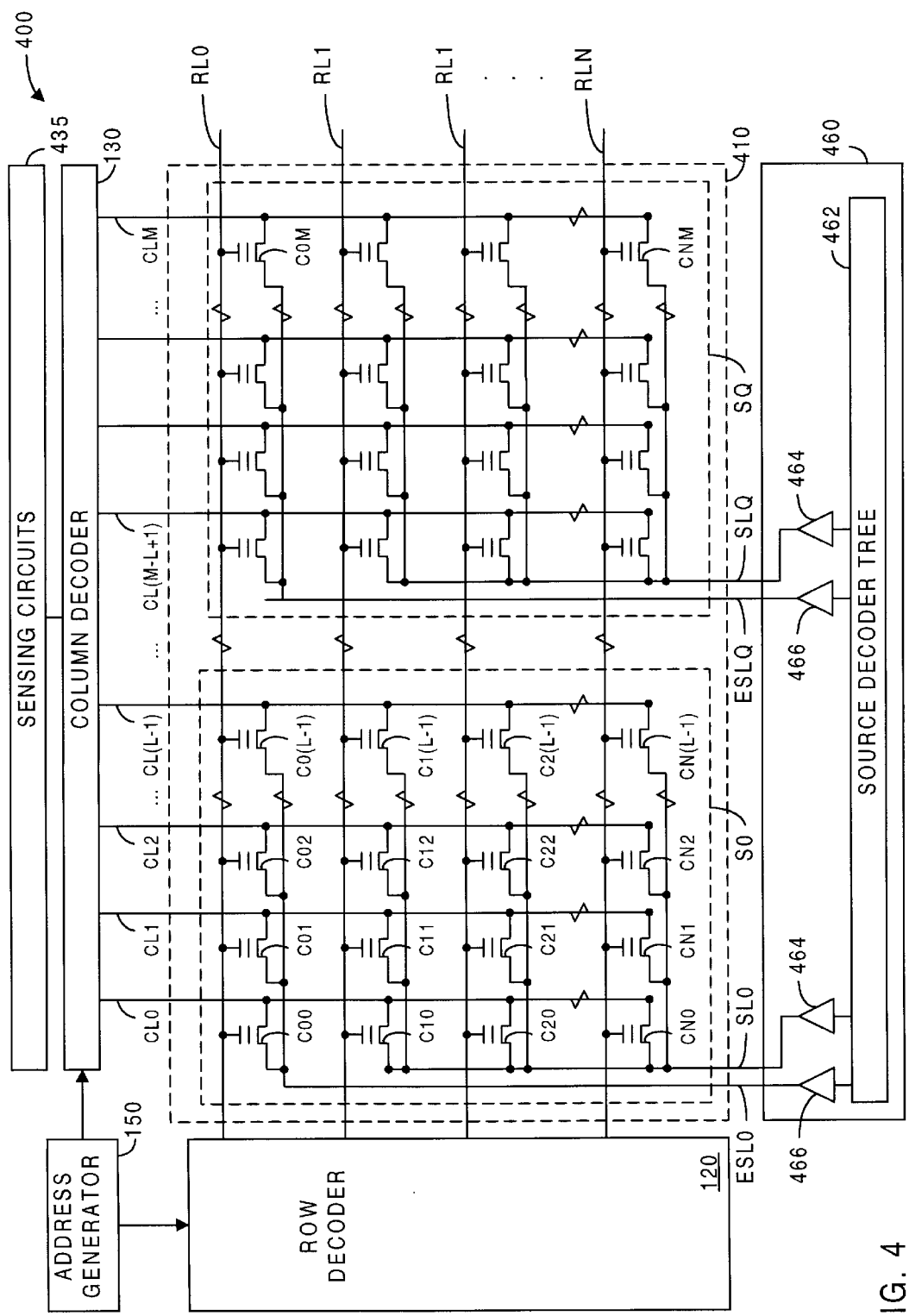
FIG. 4 shows a block diagram of a memory having separate source lines for EOM cells in accordance with an embodiment of the invention.

FIG. 4 shows a memory 400 in accordance with another alternative embodiment of the invention. Memory 400 differs from memory 100 of FIG. 1 in that each sector has two source lines. Source lines SL0 to SLQ couple to the sources of the storage cells of respective sectors S0 to SLQ of array 410. Source lines ESL0 to ESLQ couple to the sources of the EOM cells of respective sectors S0 to SLQ. Sector S0, for example, has a source line SL0 coupled to the sources of storage cells C10 . . . C1(L-1), . . . , CN0 . . . CN(L-1) and a source line ESL0 coupled to the sources of EOM cells C00 to C0(L-1). Source decoder 460 control the source voltages for storage cells and EOM cells and includes a first set of drivers 464 for storage cells and a second set of drivers 466 for EOM cells. During an erase, a conventional decoder tree 462 decodes a sector number (i.e. the most significant bits of a column address) to select a sector to be erased. In accordance with an aspect of the invention, drivers 466 apply an erase voltage to EOM cells of the selected sector that differs from the erase voltage that drivers 464 apply to storage cells in the selected sector. In an exemplary embodiment of the invention, decoder 460 applies an erase voltage of about 12 volts to the source line for the selected sector during an erase and decoder 460 applies an erase voltage of about 10 volts. Accordingly, EOM cells are erased to a state that differs from the erased state of the storage cells. In particular, the EOM cells after an erase have a threshold voltage corresponding to a partially programmed of storage cells. This provides a margin that prevents an EOM cell from becoming overerased and conducting when an associated word line is grounded or otherwise unselected. However, the erase time of the EOM cells may be longer because of the lower erase voltage.

The erase process for memory 400 can be used with conventional methods for programming the EOM cells or with the recording process described above in regard to FIG. 2. In either case, the EOM cells marking the boundaries of messages are programmed to a threshold voltage that differs from (and is typically higher than) the threshold voltage of the erased state of the EOM cells. To determine whether an EOM cell stores a mark indicating a boundary of a message, a voltage between the threshold voltage of the partially programmed state of the EOM cells and the fully program state of the EOM cells is applied to row line RL0, and the column line associated with the EOM is sensed. A binary determination is then made based on whether the EOM cell conducts. For example, if the marked state has a threshold voltage higher than the erased state, the EOM cell not conducting indicates a boundary of a message.

An alternative use of memory 400 occurs during a read or playback operation. During a playback operation, read circuitry including row decoder 120, column decoder 130, and source decoder 460 serially biases selected storage cells so that sensing circuits 435 can sense the threshold voltages of the selected cells and generate an output signal indicated by the samples read from the selected cells. For proper operation, every memory cell coupled to a selected column line except a selected storage cell should not conduct so that sensing circuits 435 sense only the operation of the selected cell. In accordance with an aspect of the invention, source decoder 460 applies a bias voltage (typically about 1 to 2 volts) to the source line of EOM cells during a playback operation while the source line for storage cells including the selected cell is grounded. This prevents the EOM cells from interfering with the playback operation by conducting while a storage cell is being read. With a bias voltage, the EOM cells can be overerased to a negative threshold voltage and still not interfere with the playback operation. The overerased EOM cells are acceptable for determination of the boundaries of messages if EOM cells storing EOM marks are programmed to a high threshold voltage. Biasing the EOM cells during a playback operation can be employed whether or not the same source voltage is used for EOM cells and storage cells during an erase.

Although the invention has been described with reference to particular embodiments, the description is only an example of the invention's application and should not be taken as a limitation. In particular, even though much of preceding discussion was aimed at N-channel devices where memory cells are programmed using channel hot electron injection to raise threshold voltages, alternative embodiments of this invention include memory cells were other write mechanisms such as Fowler-Nordhiem tunneling is used to raise or lower threshold voltages. Further, alternative embodiments of the invention include not only analog memories where each memory cell stores a sample having a continuous range of values but also to multi-level digital memory where multiple bits of a digitized sample are stored in each cell or even binary memory where a single bit or a digitized sample is stored in each cell. Various other adaptations and combinations of features of the embodiments disclosed are within the scope of the invention as defined by the following claims.

We claim:

1. A method for recording a message in a memory that includes EOM cells dedicated to storage of marks indicating boundaries of messages, wherein for each EOM cell in a set of the EOM cells, the method comprises:

sampling an input signal to determine a sample associated with a current period of a sampling clock;

writing the sample for the current period in one or more storage cells associated with the EOM cell;

applying a write pulse to the EOM cell during the current period; and repeating the steps of sampling, writing, and applying for each of a plurality of periods of the sampling clock.

2. The method of claim 1, wherein for each EOM cell in the set, the method further comprises:

testing a threshold voltage of the EOM cell to determine whether the threshold voltage has reached a first level; and repeating the steps of sampling and writing for each of a second plurality of periods of the sampling clock, wherein the second plurality of periods follows determining that the threshold voltage of the EOM cell has reached the first level, and wherein the threshold voltage of the EOM cell is unchanged during the second plurality of periods.

3. The method of claim 2, further comprising:

identifying the EOM cell associated with one or more storage cells to which a last sample in the message was written; and applying programming pulses to the identified EOM cell to change a threshold voltage of the identified EOM cell to a second level that differs from the first level and marks a boundary of the message.

4. The method of claim 2, further comprising:

identifying the EOM cell associated with one or more storage cells to which a last sample in the message was written; and leaving an adjacent EOM cell in an erased state to mark the boundary of the message.

5. The method of claim 1, wherein each EOM cell and the storage cells associated with the EOM cell comprise a plurality of memory cells that are together in a column in a memory array.

6. The method of claim 5, wherein the set of EOM cells comprise a plurality of memory cells that are together in a row of the memory array.

7. The method of claim 1, wherein writing the sample for the current period comprises writing an analog value to a memory cell.

8. A memory comprising:

a memory array that includes storage cells dedicated to storage of samples that constitute messages and EOM cells dedicated to storage of marks indicating boundaries of the messages, wherein each EOM cells is associated with a set of storage cells, and a first value being stored in an EOM cell indicates that the storage cell associated with the EOM cell is at the boundary of the message stored in the array; and write circuitry coupled to the memory array, wherein the write circuitry comprises means for applying a write pulse to an EOM cell associated with a storage cell during a process that writes a sample to the storage cell.

9. The memory of claim 8, wherein the EOM cells are in a row of the memory array, and for each EOM cell, the storage cells associated with the EOM cell are in a column with the EOM cell.

10. The memory of claim 8, wherein the EOM cells are in a column of the memory array, and for each EOM cell, the storage cells associated with the EOM cell are in a row with the EOM cell.

11. A memory comprising a memory array that includes storage cells dedicated to storage of samples that constitute messages and EOM cells dedicated to storage of marks indicating boundaries of the messages, wherein the EOM cells are in a first row of the memory array, and a first value stored in a first EOM cell indicates that a column containing the first EOM cell also contains the storage cell at the boundary of a message stored in the array.

12. The memory of claim 11, further comprising a row decoder coupled to the memory array, wherein the row decoder comprises means for applying a write pulse to an EOM cell in the column with the storage cell during a process that writes a sample to the storage cell.

13. A memory comprising:

an array of memory cells that is partitioned into a plurality of independently erasable sectors, wherein each sector comprises:

storage cells dedicated for storage of data representing messages;

EOM cells dedicated for storage of marks indicating a boundary of a message;

a first source line coupled to sources of the storage cells in the sector; and a second source line coupled to sources of the EOM cells in the sector; and an erase circuit coupled to the first and second source lines of each sector, wherein the erase circuit applies a first voltage to the first source line of a sector selected for an erase and a second voltage that differs from the first voltage to the second source line of the sector selected for an erase.

14. The memory of claim 13, wherein each sector comprises a plurality of columns of memory cells in the array and the EOM cells of the sectors are all in the same row of the array.

15. A method for operating a memory, comprising erasing a sector of memory cells in a memory array, wherein erasing comprises:

applying a first erase voltage to sources of a first set of memory cells in the sector, wherein the first set of memory cells are dedicated for storage of data representing messages; and applying a second erase voltage to sources of a second set of memory cells in the sector, the second erase voltage differing from the first erase voltage, wherein the second set of memory cells are dedicated for storage of marks identifying boundaries of the messages.

16. The method of claim 15, wherein erasing the sector leaves the second set of memory cells with a higher threshold voltage than that of the first set of memory cells.

17. The method of claim 16, further comprising:

writing data representing a message to first set of memory cells; and programming a memory cell in the second set of memory cells to a higher threshold voltage to mark a boundary of the message.

18. A memory comprising:

an array of memory cells that is partitioned into a plurality of independently erasable sectors, wherein each sector comprises:

storage cells dedicated for storage of data representing messages;

EOM cells dedicated for storage of marks indicating boundaries of messages;

a first source line coupled to sources of the storage cells in the sector; and a second source line coupled to sources of the EOM cells in the sector; and a read circuit coupled to the first and second source lines of each sector, wherein the read circuit applies a first voltage to the first source line of a sector to be read and a second voltage that differs from the first voltage to the second source line of the sector.

19. The memory of claim 18, wherein each sector comprises a plurality of columns of memory cells in the array and the EOM cells of the sectors are all in the same row of the array.

20. A method for reading a selected memory cell in a memory array, comprising:

applying a first voltage to sources of memory cells in a first set of memory cells in the memory array, wherein the first set of memory cells is dedicated for storage of data representing messages and includes the selected memory cell; and applying a second voltage to sources of memory cells in a second set of memory cells including a memory cell having a drain coupled to a drain of the selected memory cell, the second voltage differing from the first voltage, wherein the second set of memory cells is dedicated for storage of marks identifying boundaries of the messages stored in the first set of memory cells.

* * * * *